United States Patent
Koshimizu et al.

(10) Patent No.: US 10,269,639 B2
(45) Date of Patent: Apr. 23, 2019

(54) METHOD OF MANUFACTURING PACKAGED WAFER

(71) Applicant: DISCO CORPORATION, Tokyo (JP)

(72) Inventors: Hideki Koshimizu, Tokyo (JP); Xin Lu, Tokyo (JP); Yurika Araya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/472,995

(22) Filed: Mar. 29, 2017

(65) Prior Publication Data

US 2017/0294353 A1  Oct. 12, 2017

(30) Foreign Application Priority Data

Apr. 6, 2016 (JP) ................................ 2016-076473

(51) Int. Cl.
    *B23K 26/00*  (2014.01)
    *H01L 21/78*  (2006.01)
    *H01L 21/56*  (2006.01)
    *H01L 21/67*  (2006.01)
    *H01L 23/31*  (2006.01)

(52) U.S. Cl.
    CPC .......... *H01L 21/78* (2013.01); *H01L 21/561* (2013.01); *H01L 21/565* (2013.01); *H01L 21/67092* (2013.01); *H01L 21/67126* (2013.01); *H01L 23/3114* (2013.01); *H01L 23/3185* (2013.01)

(58) Field of Classification Search
    CPC ...................... H01L 21/67092; H01L 21/6836
    See application file for complete search history.

(56) References Cited

U.S. PATENT DOCUMENTS

2016/0276306 A1*  9/2016  Kamphuis ............... H01L 24/94

FOREIGN PATENT DOCUMENTS

JP  2006-100535  4/2006

* cited by examiner

*Primary Examiner* — Mohammad Choudhry
(74) *Attorney, Agent, or Firm* — Greer Burns & Crain Ltd.

(57) ABSTRACT

Disclosed herein is a method of manufacturing a packaged wafer including a step of forming grooves in a face side of a wafer along projected dicing lines to a depth larger than a finished thickness of the wafer, a step of forming a ring-shaped groove in and along a boundary between a device area and an outer peripheral excess area of the wafer to a depth larger than the depth of the grooves, and a step of placing a recess mold of a molding apparatus in engagement with the wafer so that a side wall of the recess mold is placed on a bottom of the ring-shaped groove and filling a space between the recess mold and the wafer with a molding resin.

1 Claim, 6 Drawing Sheets

METHOD OF MANUFACTURING PACKAGED WAFER

BACKGROUND OF THE INVENTION

Field of the Invention

The present invention relates to a method of manufacturing a packaged wafer whose face side has been encapsulated by a molding resin.

Description of the Related Art

In recent years, attention has been attracted to the wafer level chip size package (WL-CSP) technology where wafers are processed in various steps up to the point of being packaged. According to the WL-CSP technology, after a plurality of devices formed on the face side of a wafer have been encapsulated by a molding resin, the wafer is divided into individual device chips. Since only the face side of the wafer is covered with the molding resin, the divided device chips have exposed side surfaces (cut surfaces) that tend to make the device chips poor in appearance. In view of such a difficulty, there has been proposed a technology for forming grooves in a wafer along projected dicing lines thereon, filling the grooves with a molding resin, and dividing the wafer together with the molding resin along the projected dicing lines into device chips, so that the side surfaces of the device chips are covered with layers of the molding resin (see, for example, Japanese Patent Laid-Open No. 2006-100535).

SUMMARY OF THE INVENTION

According to the technology disclosed in Japanese Patent Laid-Open No. 2006-100535, however, because the grooves are formed along the projected dicing lines fully across the wafer, when the face side of the wafer is covered with the molding resin, the molding resin is liable to leak out of the ends of the grooves that are exposed at the outer peripheral surface of the wafer. Consequently, the grooves in the wafer may not be appropriately filled up with the molding resin.

It is therefore an object of the present invention to provide a method of manufacturing a packaged wafer to cover the face side of a wafer with a molding resin and appropriately fill up grooves in the wafer with the molding resin.

In accordance with an aspect of the present invention, there is provided a method of manufacturing a packaged wafer, including a groove forming step, a ring-shaped groove forming step, and a molding resin filling step. The groove forming step forms grooves in a face side of a wafer along projected dicing lines thereon to a depth larger than a finished thickness of the wafer, the wafer having a device area in which a plurality of bumped devices are formed in respective regions demarcated by a grid of the projected dicing lines and an outer peripheral excess area surrounding the device area. The ring-shaped groove forming step forms a ring-shaped groove in and along a boundary between the device area and the outer peripheral excess area of the wafer to a depth larger than the depth of the grooves and up to a given value in a thicknesswise direction of the wafer. After the groove forming step and the ring-shaped groove forming step have been performed, the molding resin filling step places a recess mold of a molding apparatus in engagement with the wafer so that a side wall of the recess mold is placed in abutment against a bottom of the ring-shaped groove with a space being created between the recess mold and the face side of the wafer in the device area, and fills the space with a molding resin. A packaged wafer is formed in which the face side of the wafer in the device area is covered with the molding resin and the molding resin is embedded in the grooves.

In the above method of manufacturing a packaged wafer, the grooves are formed in the wafer along the projected dicing lines fully across the wafer, and the ring-shaped groove is formed in the boundary between the device area and the outer peripheral excess area of the wafer. When the side wall of the recess mold of the molding apparatus engages in the ring-shaped groove, the lower surface of the ring-shaped side wall abuts against the bottom surface of the ring-shaped groove at a position deeper than the grooves along the projected dicing lines, sealing the periphery of the device area in a light-tight manner. When the molding resin is supplied to fill up the space between the mold and the face side of the wafer in the device area, therefore, the molding resin is prevented from leaking out from the device area on the face side of the wafer. Accordingly, it is possible to manufacture a packaged wafer wherein the face side of the wafer in the device area is covered with the molding resin and the molding resin is embedded in the grooves defined in the device area along the projected dicing lines.

According to the present invention, after the grooves have been formed in the wafer along the projected dicing lines thereon, the boundary between the device area and the outer peripheral excess area of the wafer is cut to form the ring-shaped groove therein for receiving the side wall of the recess mold of the molding apparatus. Then, the recess mold is set on the wafer so as to have the side wall engage in the ring-shaped groove. The side wall of the recess mold is effective to prevent the molding resin from leaking out from the wafer when the molding resin is supplied to fill the space between the recess mold and the wafer. Consequently, a packaged wafer in which the device area is covered with the molding resin and the molding resin is embedded in the grooves is manufactured.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
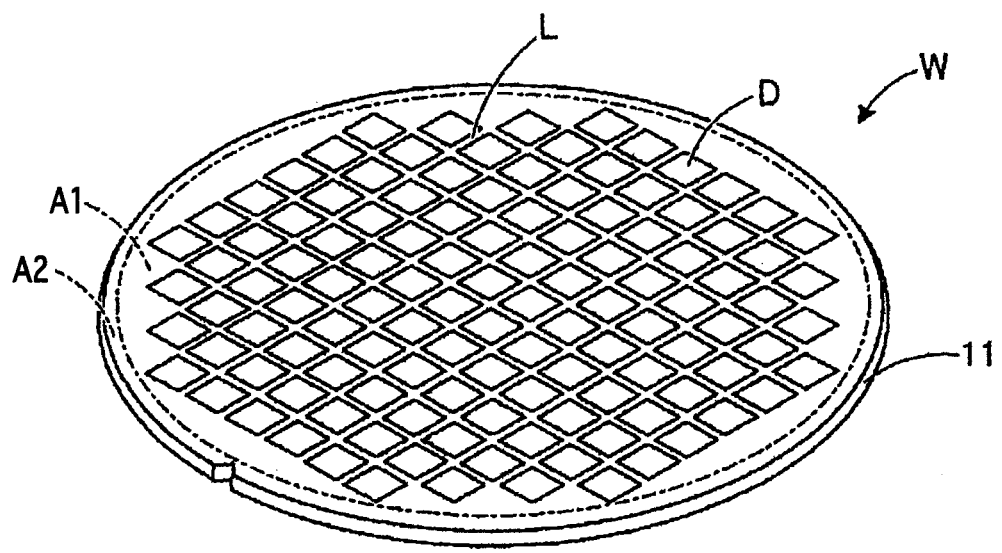
FIG. 1 is a perspective view of a wafer to be packaged by a method of manufacturing a packaged wafer according to an embodiment of present invention.
Figure 2A:
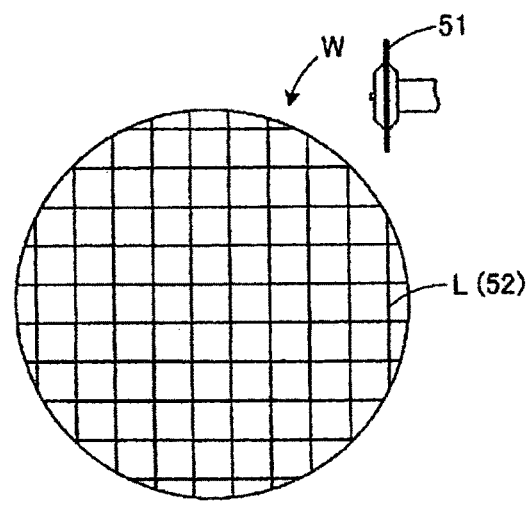
FIG. 2A is a plan view showing a groove forming step according to a first comparative example.
Figure 2B:
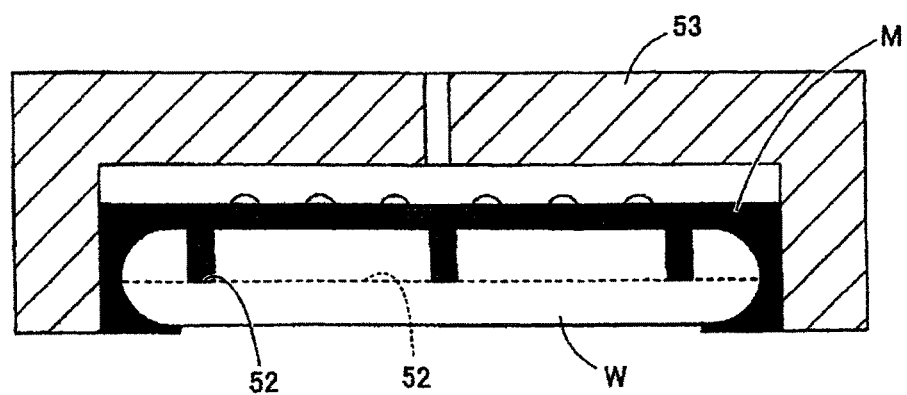
FIG. 2B is a cross-sectional view showing a molding resin filling step according to the first comparative example.
Figure 3A:
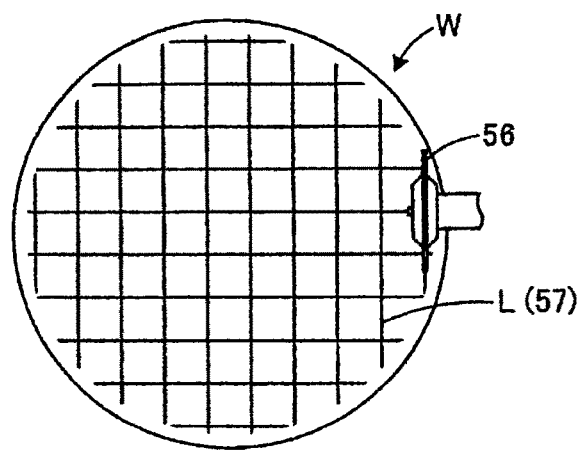
FIG. 3A is a plan view showing a groove forming step according to a second comparative example.
Figure 3B:
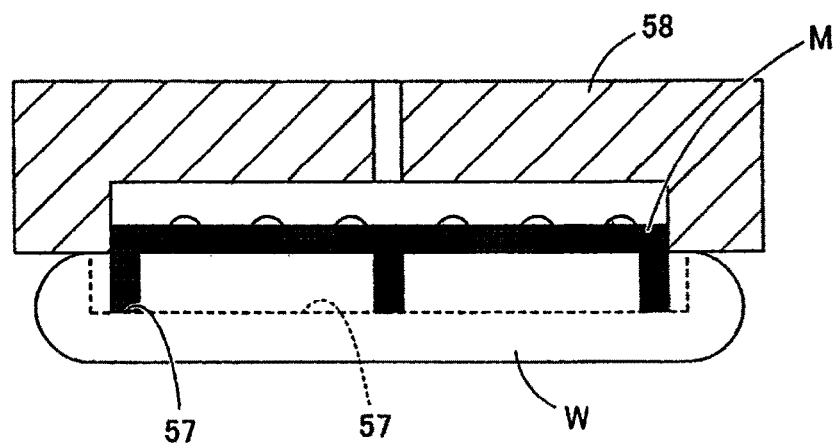
FIG. 3B is a cross-sectional view showing a molding resin filling step according to the second comparative example.

A method of manufacturing a packaged wafer according to an embodiment of the present invention will be described below with reference to the accompanying drawings. First, a wafer to be packaged will be described below. FIG. 1 shows in perspective a wafer to be packaged by the method of manufacturing a packaged wafer according to the present embodiment. FIGS. 2A and 2B illustrate a method of manufacturing a packaged wafer according to a first comparative example, and FIGS. 3A and 3B illustrate a method of manufacturing a packaged wafer according to a second comparative example. In FIGS. 2B and 3B, the broken lines indicate the bottoms of grooves defined in wafers that extend in leftward and rightward directions on the sheets of FIGS. 2B and 3B.

As shown in FIG. 1, the face side of a wafer W is demarcated into a plurality of regions by a grid of projected dicing lines L, with bumped devices D (bumps omitted from illustration) formed individually in the demarcated regions. The face side of the wafer W includes a device area A1 where the devices D are formed and an outer peripheral excess area A2 surrounding the device area A1. The outer peripheral excess area A2 has an outer peripheral side surface beveled into a beveled edge 11 for preventing the wafer W from being chipped. The wafer W may include, for example, a semiconductor wafer having a plurality of semiconductor devices such as integrated circuits (ICs), large scale integrations (LSIs), etc. formed on a semiconductor substrate.

Normally, the face side of the wafer W is encapsulated by a molding resin to produce a packaged wafer. When the packaged wafer thus produced is divided into device chips, the device chips have only upper device surfaces covered with the molding resin and have exposed side surfaces that tend to make the device chips poor in appearance. To solve this problem, it has been proposed, as shown in FIG. 2A, to half-cut the wafer W along the projected dicing lines L fully across the wafer W with a dicing blade 51, forming grooves 52 along the projected dicing lines L in the face side of the wafer W, and then to fill the grooves 52 with a molding resin M (see FIG. 2B). When the wafer W is thereafter divided into device chips along the projected dicing lines L, the device chips have side surfaces covered with the molding resin M that has filled the grooves 52.

As shown in FIG. 2B, the molding resin M is supplied to the space between the face side of the wafer W and a mold 53 that is covering the face side of the wafer W and the outer peripheral surface thereof. At this time, the supplied molding resin M leaks out of the ends of the grooves 52 that are exposed on the outer peripheral surface of the wafer W. Therefore, the entire face side of the wafer W and the outer peripheral surface thereof are covered with the molding resin M, completely concealing the projected dicing lines L, i.e., the grooves 52. As the projected dicing lines L, i.e., the grooves 52, are completely concealed, it is impossible for the wafer W to be divided along the projected dicing lines L. It is thus necessary to remove the molding resin M from the outer peripheral surface of the wafer W by polishing or trimming, partly exposing the projected dicing lines L. This removal step increases the number of steps required to produce the packaged wafer.

It has also been proposed, as shown in FIG. 3A, to half-cut a wafer W along projected dicing lines L with a dicing blade 56, forming grooves 57 only within an inner region of the wafer W, leaving an outer peripheral region thereof uncut, and then to fill the grooves 57 with a molding resin M (see FIG. 3B). As shown in FIG. 3B, the molding resin M is supplied to the space between the face side of the wafer W and a mold 58 that is covering the outer peripheral surface of the wafer W. At this time, since the grooves 57 are formed only with the inner region of the wafer W, the supplied molding region M does not leak out form the wafer W. Therefore, the outer peripheral surface of the wafer W on which the mold 58 is placed is not covered with the molding resin M, exposing the projected dicing lines L, i.e., the grooves 57, on the outer peripheral surface of the wafer W.

For forming the grooves 57 only within the inner region of the wafer W, the dicing blade 56 (see FIG. 3A) moves to incise the wafer W (chopper cut) downwardly directly from above when the dicing blade 56 starts to cut the wafer W. At this time, the dicing blade 56 has to be lowered slowly in order to prevent the wafer W from being fractured. Therefore, the time required to form the grooves 57 in the wafer W is long, resulting in a reduction in the working efficiency, although the number of steps of a polishing process or the like to be performed subsequently on the wafer W can be reduced as the outer peripheral surface of the wafer W is not covered with the molding resin M. Accordingly, there has been a demand for a method of manufacturing a packaged wafer in a manner to take into account not only the number of steps of a polishing process or the like to be performed subsequently on the wafer W, but also the time required to form the grooves 57 in the wafer W.

According to the present embodiment, after the grooves 12 have been formed in the wafer W along the projected dicing lines L fully across the wafer W, a ring-shaped groove 13 is formed in and along the boundary between the device area A1 and the outer peripheral excess area A2. Then, a recess mold 31 is set on the wafer W so as to engage in the ring-shaped groove 13 (see FIGS. 4 through 6). The molding resin M is supplied to fill up the grooves 12 while the boundary between the device area A1 and the outer peripheral excess area A2 is being sealed in a light-tight fashion by the mold 31 on the wafer W. Consequently, the molding resin M is prevented from leaking out from the device area A1. In addition, a dicing blade is moved to incise the wafer W laterally from a side of the wafer W, so that the required to form the grooves 12 in the wafer W is not unduly increased.

Figure 4:
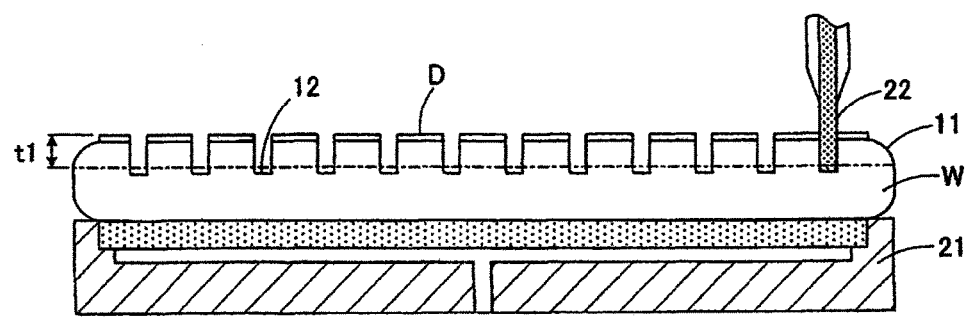
FIG. 4 is a cross-sectional view showing by way of example a groove forming step according to the embodiment of the present invention.
Figure 5:
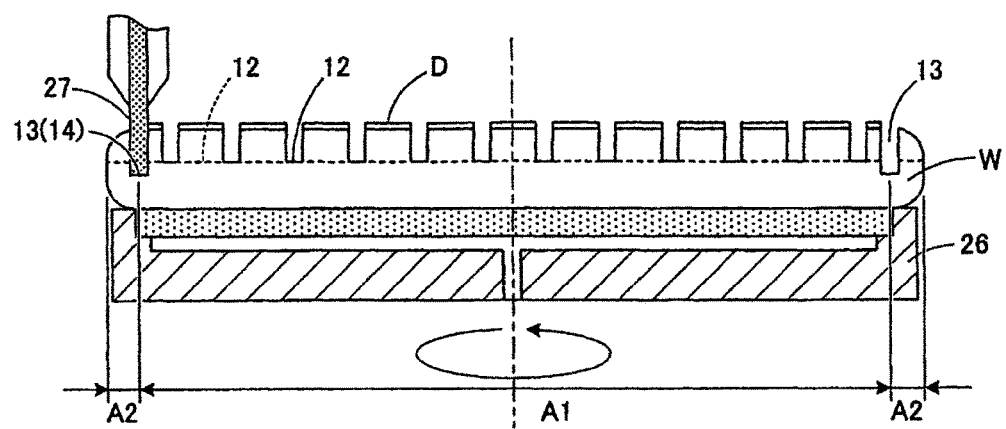
FIG. 5 is a cross-sectional view showing by way of example a ring-shaped groove forming step according to the embodiment of the present invention.
Figure 6:
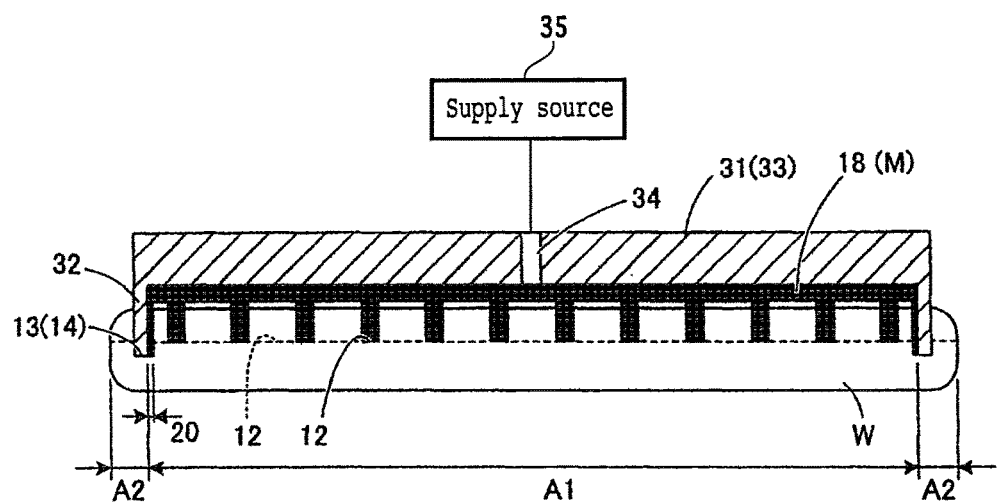
FIG. 6 is a cross-sectional view showing by way of example a molding resin filling step according to the embodiment of the present invention.
Figure 7:
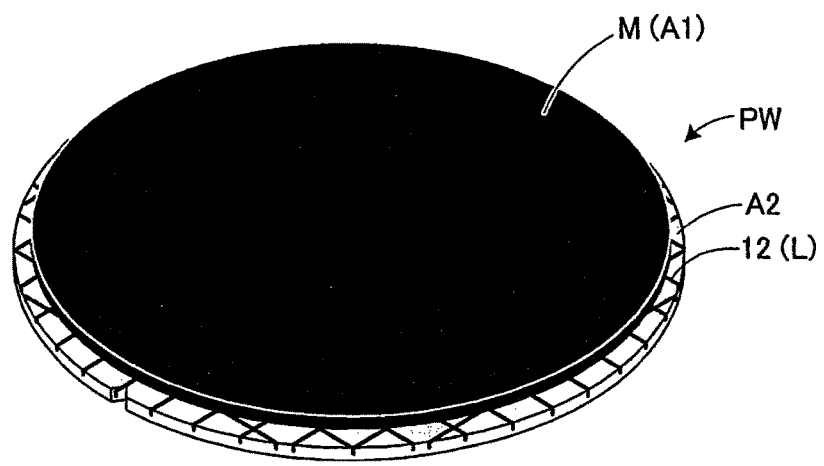
FIG. 7 is a perspective view of a packaged wafer according to the embodiment of the present invention.

The method of manufacturing a packaged wafer according to the present embodiment will be described below in detail with reference to FIGS. 4 through 6. FIG. 4 shows in cross section a groove forming step according to the present embodiment by way of example, FIG. 5 shows in cross section a ring-shaped groove forming step according to the present embodiment by way of example, and FIG. 6 shows in cross section a molding resin filling step according to the present embodiment by way of example. FIG. 7 shows in perspective a packaged wafer manufactured according to the embodiment. For the convenience of explanation, bumps are omitted from illustration. In FIGS. 5 and 6, the broken lines indicate the bottoms of grooves defined in the wafer W that extend in leftward and rightward directions on the sheets of FIGS. 5 and 6.

First, as shown in FIG. 4, a groove forming step is carried out. In the groove forming step, a wafer W is transferred to a chuck table 21 of a dicing apparatus, and held on the chuck table 21 under suction with the face side of the wafer W facing upwardly. In an area radially outward of the wafer W, a dicing blade 22 is positioned in alignment with a projected dicing line L (see FIG. 1) on the wafer W, and then lowered to a position deeper than a finished thickness t1 of the wafer W. Then, the chuck table 21 is cutting-fed with respect to the dicing blade 22, i.e., is moved laterally across the dicing blade 22 along the projected dicing line L so that the dicing blade 22 traverses and incises the face side of the wafer W laterally from one side of the wafer W, thereby half-cutting the wafer W on the chuck table 21 along the projected dicing line L thereby to form a groove 12 in the wafer W to a depth larger than the finished thickness t1.

The above dicing process is repeated to form grooves 12 along all the projected dicing lines L on the wafer W that is held on the chuck table 21. During the dicing process, the dicing blade 22 incises the wafer W laterally from one side thereof transversely fully across the wafer W. Since the dicing blade 22 does not move to incise the wafer W downwardly directly from above, the time required to form the grooves 12 in the wafer W is shortened. The finished thickness t1 referred to above represents a thickness to which the wafer W has been ground in a device chip fabrication method to be described later (see FIG. 9).

As shown in FIG. 5, a ring-shaped groove forming step is then carried out after the groove forming step. In the ring-shaped groove forming step, the wafer W with its face side facing upwardly is held under suction on a chuck table 26. The wafer W is held on the chuck table 26 such that the central axis of the wafer W is aligned with the rotational axis of the chuck table 26. Then, a dicing blade 27 is positioned above the wafer W in alignment with the boundary between the device area A1 and the outer peripheral excess area A2 of the wafer W. The dicing blade 27 is rotated about its own axis at a high speed, and is moved downwardly to incise the boundary between the device area A1 and the outer peripheral excess area A2 to a depth deeper than the grooves 12 along the projected dicing lines L (see FIG. 1).

Then, the chuck table 26 is rotated about its rotational axis with respect to the dicing blade 27, so that the dicing blade 27 forms a ring-shaped groove 13 in and along the boundary between the device area A1 and the outer peripheral excess area A2, i.e., along the outer peripheral surface of the wafer W, to a depth deeper than the grooves 12 and up to a predetermined value in a thicknesswise direction of the wafer W. The ring-shaped groove 13 separates the grooves 12 along the projected dicing lines L at the boundary between the device area A1 and the outer peripheral excess area A2. The dicing blade 27 has a flat outer peripheral tip end. Therefore, the ring-shaped groove 13 has a flat bottom surface 14. The ring-shaped groove forming step may be performed before the groove forming step.

As shown in FIG. 6, a molding resin filling step is then carried out after the groove forming step and the ring-shaped groove forming step. In the molding resin filling step, the wafer W is loaded into a molding apparatus wherein a recess mold 31 is placed over the face side of the wafer W. The recess mold 31 has a ring-shaped side wall 32 extending along its outer peripheral surface and projecting downwardly. When the recess mold 31 is placed over the face side of the wafer W, the ring-shaped side wall 32 is inserted into the ring-shaped groove 13 in the wafer W until the lower surface of the ring-shaped side wall 32 abuts against the flat bottom surface 14 of the ring-shaped groove 13. When the ring-shaped side wall 32 fully engages in the ring-shaped groove 13, a space 18 is created between the face side of the wafer W in the device area A1 and the mold 31 placed over the wafer W.

In order to allow the mold 31 to engage the face side of the wafer W smoothly, i.e., to allow the ring-shaped side wall 32 to enter the ring-shaped groove 13 smoothly, there is a small clearance 20 provided between the ring-shaped side wall 32 of the mold 31 and an annular surface of the wafer W that defines the ring-shaped groove 13 therein. Furthermore, as the flat bottom surface 14 of the ring-shaped groove 13 is deeper than the bottom surfaces of the grooves 12 defined in the wafer W along the projected dicing lines L (see FIG. 1), the ring-shaped side wall 32 of the mold 31 which is inserted in the ring-shaped groove 13 in the wafer W seals the space 18 within the mold 31 in a light-tight fashion. Then, a supply source 35 supplies the mold 31 with a molding resin M which flows through a supply port 34 defined in an upper wall 33 of the mold 31 to fill up the space 18 between the mold 31 and the face side of the wafer W in the device area A1.

When the molding resin M fills up the space 18 and hence the device area A1, the molding resin M enters the grooves 12 along the projected dicing lines L and flows along the grooves 12 radially outwardly toward the outer peripheral surface of the wafer W. When the molding resin M in the grooves 12 reaches the ring-shaped side wall 32 of the mold 31, the molding resin M flows downwardly along the clearance 20 to the flat bottom surface 14 of the ring-shaped groove 13. Since the lower surface of the ring-shaped side wall 32 of the mold 31 is held in abutment against the flat bottom surface 14 of the ring-shaped groove 13, the molding resin M is reliably blocked against leakage out of the wafer W by the ring-shaped side wall 32 of the mold 31. The molding resin M thus covers the face side of the wafer W without leaking out from the outer peripheral surface of the wafer W.

Figure 9:
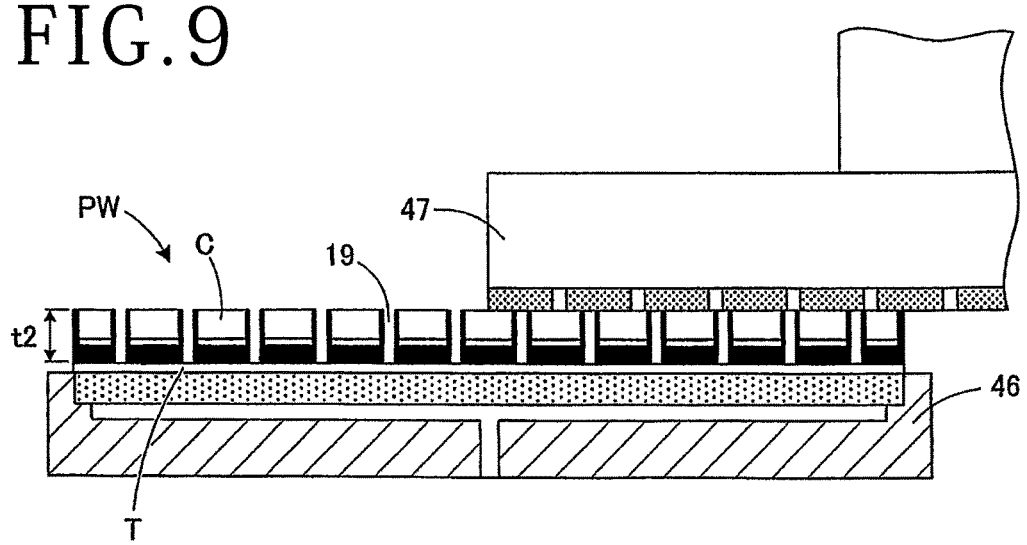
FIG. 9 is a cross-sectional view showing by way of example a dividing step according to the embodiment of the present invention.

As shown in FIG. 7, there is now fabricated a packaged wafer PW in which the face side of the wafer W in the device area A1 is covered with the molding resin M and the molding resin M is embedded in the grooves 12 defined in the device area A1 along the projected dicing lines L. Since the molding resin M in the grooves 12 in the packaged wafer PW will serve as side surfaces of device chips C after they are diced from the packaged wafer PW, the device chips C are of good appearance because not only the face sides of the device chips C, but also the side surfaces thereof are covered with the molding resin M, as shown in FIG. 9. Moreover, inasmuch as only the device area A1 of the packaged wafer PW is covered with the molding resin M, but the projected dicing lines L or the grooves 12 in the outer peripheral excess area A2 are exposed to external view, the packaged wafer PW can easily be diced into the individual device chips C, on the basis of the exposed projected dicing lines L used as a marker.

Consequently, unlike the wafer W according to the first comparative example shown in FIGS. 2A and 2B, no polishing or trimming is necessary, and the time and the number of steps required to produce the packaged wafer are reduced. Furthermore, unlike the wafer W according to the second comparative example shown in FIGS. 3A and 3B, the dicing blade is not required to move to incise the wafer W downwardly directly from above when the dicing blade starts to cut the wafer W. As the dicing blade 22 traverses and incises the face side of the wafer W laterally from one side of the wafer W, forming the grooves 12 therein, the time required to form the grooves 12 is reduced.

In the method of manufacturing the packaged wafer PW according to the present embodiment, as described above, the grooves 12 are formed in the wafer W along the projected dicing lines L fully across the wafer W, and the ring-shaped groove 13 is formed in the boundary between the device area A1 and the outer peripheral excess area A2 of the wafer W. When the ring-shaped side wall 32 of the recess mold 31 of the molding apparatus engages in the ring-shaped groove 13, the lower surface of the ring-shaped side wall 32 abuts against the flat bottom surface 14 of the ring-shaped groove 13 at a position deeper than the grooves 12 along the projected dicing lines L, sealing the periphery of the device area A1 in a light-tight manner. When the molding resin M is supplied to fill up the space 18 between the mold 31 and the face side of the wafer W in the device area A1, therefore, the molding resin M is prevented from leaking out from the device area A1 on the face side of the wafer W. Accordingly, it is possible to manufacture the packaged wafer PW wherein the face side of the wafer W in the device area A1 is covered with the molding resin M and the molding resin M is embedded in the grooves 12 defined in the device area A1 along the projected dicing lines L.

Figure 8:
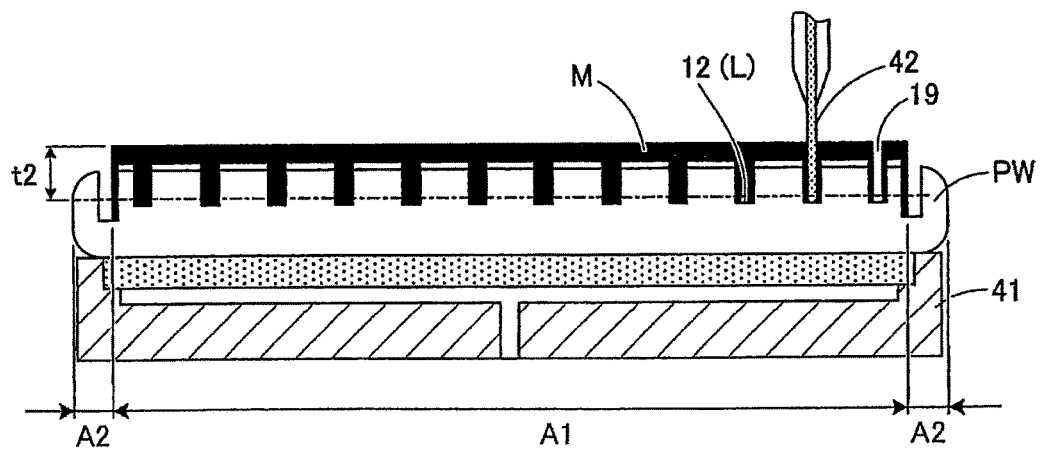
FIG. 8 is a cross-sectional view showing by way of example a cut groove forming step according to the embodiment of the present invention.

A method of fabricating device chips will be described below in detail with reference to FIGS. 8 and 9. FIG. 8 shows in cross section a cut groove forming step according to the present embodiment by way of example, and FIG. 9 shows in cross section a dividing step according to the present embodiment by way of example.

As shown in FIG. 8, a cut groove forming step is initially carried out. In the cut groove forming step, the packaged wafer PW is transferred to a chuck table 41 of a cutting apparatus, and held on the chuck table 41 under suction with the face side of the packaged wafer PW facing upwardly. The cutting apparatus employs a dicing blade 42 which is thinner than the width of the grooves 12 in the packaged wafer PW so that layers of the molding resin M remains in the grooves 12 when the dicing blade 42 cuts the packaged wafer PW along the projected dicing lines L. As only the face side of the packaged wafer PW in the device area A1 is covered with the molding resin M, the dicing blade 42 is positioned in alignment with a projected dicing line L on the packaged wafer PW in an area radially outward of the packaged wafer PW on the basis of the projected dicing lines L (see FIG. 7) in the outer peripheral excess area A2 used as a marker.

The dicing blade 42 is then lowered to a position deeper than a finished thickness t2 of the packaged wafer PW. Then, the chuck table 41 is cutting-fed with respect to the dicing blade 42, i.e., is moved laterally across the dicing blade 42 along the projected dicing line L so that the dicing blade 42 traverses and incises the face side of the wafer W laterally from one side of the packaged wafer PW, thereby half-cutting the packaged wafer PW on the chuck table 41 centrally along the projected dicing line L filled with the molding resin M thereby to form a cut groove 19 in the packaged wafer PW to a depth larger than the finished thickness t2. The above dicing process is repeated to form cut grooves 19 along all the projected dicing lines L on the wafer W that is held on the chuck table 41. In this manner, the cut grooves 19 are formed in the packaged wafer PW with the molding resin M remaining therein, using the dicing blade 42 which is narrower than the width of the grooves 12 filled with the molding resin M.

Then, as shown in FIG. 9, the dividing step is carried out after the cut groove forming step. In the dividing step, the packaged wafer PW with a protective tape T applied to the face side thereof is transferred to a chuck table 46 of a grinding apparatus, and held on the chuck table 46 under suction with the protective tape T interposed between the packaged wafer PW and the chuck table 46, i.e., with the reverse side of the packaged wafer PW facing upwardly. A grinding wheel 47 is then held against the reverse side of the packaged wafer PW. The grinding wheel 47 and the packaged wafer PW are relatively rotated about their own axes to grind the packaged wafer PW to the finished thickness t2, whereupon the cut grooves 19 appear on the reverse side of the packaged wafer PW, dividing the packaged wafer PW into individual device chips C. In this fashion, the device chips C each having outer peripheral edges surrounded by respective layers of the molding resin M are produced.

Fabrication of the device chips is not limited to the above method sequence in which after the cut grooves 19 have been formed in the face side of the packaged wafer PW, the reverse side of the packaged wafer PW is ground to divide the packaged wafer PW into the individual device chips C. The device chips C may be fabricated according to other method sequences as long as they can be produced from the packaged wafer PW. For example, after the reverse side of the packaged wafer PW has been ground to the finished thickness, the packaged wafer PW may be cut into the individual device chips C.

The present invention is not limited to the above embodiment, but various changes and modifications may be made therein. Specifically, the present invention is not limited to sizes and shapes illustrated in the accompanying drawings, but they may be changed and modified to the extent that the principles of the present invention remain effectively applicable. Other changes and modifications may be made without departing from the scope of the invention.

For example, in the molding resin filling step according to the above embodiment, the face side of the wafer W is filled with the molding resin M while the mold 31 is being held in engagement with the face side of the wafer W. However, in the molding resin filling step, an appropriate amount of the molding resin M may be dropped onto the face side of the wafer W, and the dropped mass of the molding resin M on the wafer W may then be pressed against the wafer W so as to fill the grooves 12 in the face side of the wafer W. Furthermore, according to the above embodiment, the groove forming step, the ring-shaped groove forming step, and the cut groove forming step are carried out by the respective different apparatus. However, these steps may be carried out by one apparatus.

According to the present invention, as described above, the face side of the wafer can be covered with the molding resin, and the grooves in the wafer can be filled up with the molding resin. The present invention is particularly useful when applied to a method of manufacturing a packaged wafer such as a WL-CSP wafer or the like.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of manufacturing a packaged wafer, comprising:
    a groove forming step of forming grooves in a face side of a wafer along projected dicing lines thereon to a depth larger than a finished thickness of the wafer, the wafer having a device area on said face side in which a plurality of bumped devices are formed in respective regions demarcated by a grid of said projected dicing lines and an outer peripheral excess area in which the bumped devices are not formed on said face side surrounding said device area;

a ring-shaped groove forming step of forming a ring-shaped groove in said face side of the wafer and along a boundary between said device area and said outer peripheral excess area of the wafer to a depth larger than the depth of said grooves and up to a given value in a thicknesswise direction of said wafer; and a molding resin filling step of, after said groove forming step and said ring-shaped groove forming step have been performed, placing a recess mold of a molding apparatus in engagement with said wafer so that a side wall of said recess mold is placed in abutment against a bottom of said ring-shaped groove with a space being created between the sidewall of said recess mold and the device area, and filling said space with a molding resin, wherein a packaged wafer is formed in which the face side of said wafer in said device area is covered with the molding resin and said molding resin is embedded in said grooves.

* * * * *